US007407254B2

(12) United States Patent
Mori

(10) Patent No.: US 7,407,254 B2

(45) Date of Patent: Aug. 5, 2008

(54) DROPLET DISCHARGE INSPECTION APPARATUS AND METHOD

(75) Inventor: Toshimasa Mori, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 416 days.

(21) Appl. No.: 11/146,141

(22) Filed: Jun. 7, 2005

(65) Prior Publication Data

US 2006/0001692 A1 Jan. 5, 2006

(30) Foreign Application Priority Data

Jul. 1, 2004 (JP) ............................ 2004-195621

(51) Int. Cl.
*B41J 29/393* (2006.01)
*C23C 16/52* (2006.01)

(52) U.S. Cl. ............................................ 347/19; 427/8

(58) Field of Classification Search .................. 347/19; 427/8

See application file for complete search history.

(56) References Cited

U.S. PATENT DOCUMENTS 6,309,691 B1 * 10/2001 Hasegawa ...................... 427/8
6,543,875 B2 * 4/2003 Gomez et al. ................ 347/23

FOREIGN PATENT DOCUMENTS

| | | |
|---|---|---|
| EP | 0 341 934 A1 | 11/1989 |
| JP | A 63-221050 | 9/1988 |
| JP | U 1-163859 | 11/1989 |
| JP | A-2-503227 | 10/1990 |
| JP | A-4-111942 | 4/1992 |
| JP | A 6-143548 | 5/1994 |
| JP | A 2004-148180 | 5/2004 |
| WO | WO 88/06268 | 8/1988 |

* cited by examiner

*Primary Examiner*—Julian D Huffman
(74) *Attorney, Agent, or Firm*—Oliff & Berridge, PLC

(57) ABSTRACT

An inspection apparatus includes an inspection body that has a non-conductive substrate, a droplet receiving portion for receiving a droplet that is provided on the substrate, and a plurality of electrodes that are exposed on an inner surface portion of the droplet receiving portion. The droplet receiving portion has a size that corresponds to a droplet size in a state when a discharged droplet impacts normally. The inspection apparatus also includes a detector that is connected to the electrodes of the inspection body and detects a conductivity in the droplet receiving portion. The inspection apparatus makes it possible to inspect easily and in a short time period the discharge performance of a droplet discharge head of a droplet discharge apparatus. A droplet discharge inspection method is also provided.

3 Claims, 6 Drawing Sheets

FIG. 6A
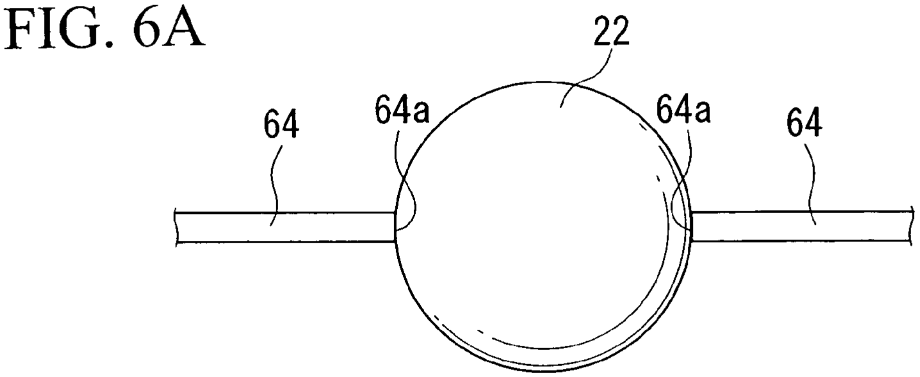
FIG. 6B
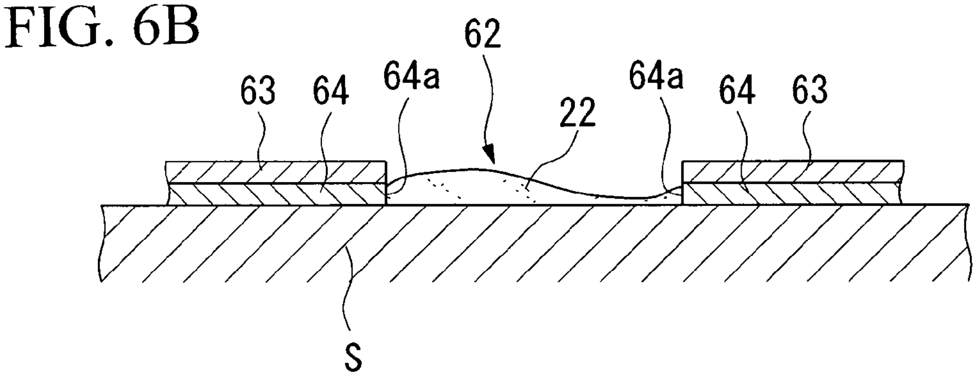
FIG. 7A
FIG. 7B
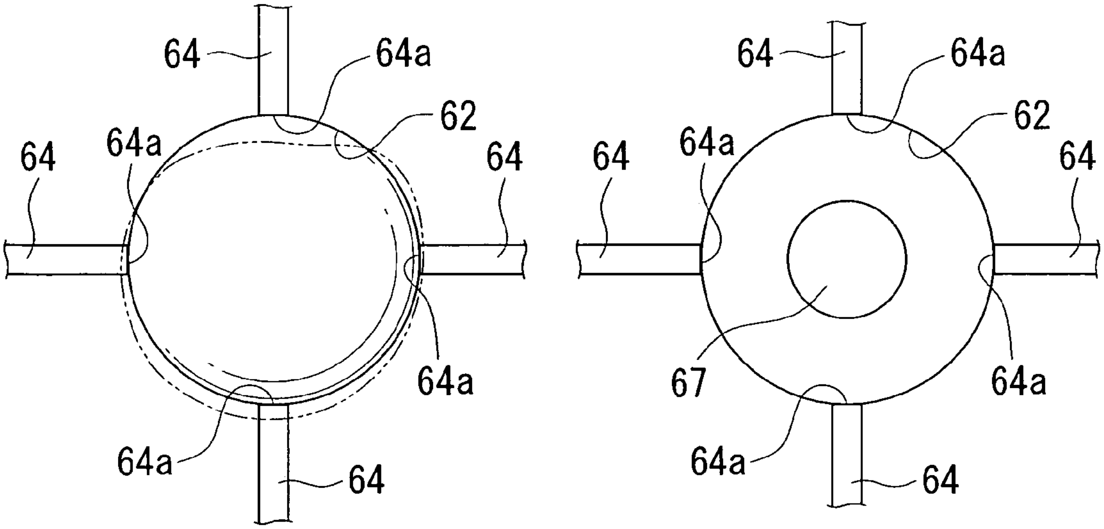

DROPLET DISCHARGE INSPECTION APPARATUS AND METHOD

BACKGROUND OF THE INVENTION

1. Field of the Invention

The present invention relates to an inspection apparatus for inspecting the discharge performance of a droplet discharge head that discharges droplets of liquid, and to a droplet discharge inspection method that inspects the discharge performance of a droplet discharge head using this apparatus.

Priority is claimed on Japanese Patent Application No. 2004-195621, filed Jul. 1, 2004, the contents of which are incorporated herein by reference.

2. Description of Related Art

Generally, apparatuses that employ inkjet technology exist as droplet discharge apparatuses that perform thin film formation and patterning and the like by discharging droplets of a liquid such as ink. These apparatuses are provided with a droplet discharge head that is supplied with a liquid material (i.e., a liquid) from a liquid material supply portion, and a stage that causes a substrate or the like to move relatively to the droplet discharge head. The apparatuses perform the thin film formation or patterning by discharging droplets onto the substrate while moving the droplet discharge head based on discharge data.

In these apparatuses, usually, an inspection is made prior to a normal droplet discharge using such an apparatus as to whether all of the nozzles in the droplet discharge head are in a proper condition, namely, whether there are any abnormalities such as blockages or adhesion of contaminants and the like.

In this inspection method, normally, a nozzle check pattern is drawn on paper on which a liquid material (i.e., ink) can be easily seen, namely, on paper that provides good visibility, such as white paper, and an inspection is made as to whether or not droplets are being discharged normally from the nozzles by viewing the condition of the obtained drawing using the naked eye or a microscope.

Among inkjet recording apparatuses that record by discharging ink onto recording paper, in particular, an apparatus is known that determines the condition of the ink discharge by reading the image recorded on the recording paper using a reading device formed by a line sensor (see, for example, Japanese Patent Application Unexamined Publication No. 6-143548).

However, in droplet discharge apparatuses that are used industrially, there is a trend towards increasing the number of nozzles in the droplet discharge head in order to raise productivity. Currently, droplet discharge apparatuses are used in which, for example, in a single droplet discharge head, nozzles are arranged in 2 rows vertically by 180 rows horizontally to provide a total of 360 nozzles. Moreover, several, for example, 12 of these droplet discharge heads are provided in a droplet discharge apparatus.

Accordingly, in this type of droplet discharge apparatus the total number of nozzles is extremely large, and when a visual inspection is made using the naked eye or a microscope, as is described above, the time needed for this inspection becomes lengthy and is the cause of a major drop in productivity.

Moreover, in inkjet recording apparatuses that discharge ink onto recording paper, as is described above, technology is known that determines the condition of the discharge using reading devices formed by line sensors. However, currently, no technology has been provided for performing checks in a short period of time for droplet discharge heads that are used industrially and, accordingly, have a large number of nozzles, as is described above.

The present invention was conceived in view of the above described circumstances, and it is an object thereof to provide, particularly in a droplet discharge apparatus that is used industrially, an inspection apparatus that makes it possible to inspect easily and in a short period of time the discharge performance of a droplet discharge head of the droplet discharge apparatus, and a droplet discharge inspection method that inspects the discharge performance of the droplet discharge head using this inspection apparatus.

SUMMARY OF THE INVENTION

In order to achieve the above object, according to an aspect of the present invention, there is provided an inspection apparatus for inspecting a discharge performance of a droplet discharge head that discharges droplets, comprising: an inspection body that includes a non-conductive substrate, a droplet receiving portion for receiving a droplet that is provided on the substrate, and a plurality of electrodes that are exposed on an inner surface portion of the droplet receiving portion, and in which the droplet receiving portion has a size that corresponds to a droplet size in a state when a discharged droplet impacts normally; and a detector that is connected to the electrodes of the inspection body and detects a conductivity in the droplet receiving portion.

In this inspection apparatus, in a state in which it has not received a discharged droplet, the droplet receiving portion is formed as a space. Accordingly, there is no electrical conduction between the plurality of electrodes that are provided in an exposed state on an inner surface portion of the droplet receiving portion. In this state, if a droplet is discharged from the droplet discharge head towards the droplet receiving portion, then if the discharged droplet has impacted in a normal state, because the droplet receiving portion is formed at a size that corresponds to the droplet, the droplet fills the droplet receiving portion. As a result, the plurality of electrodes that are exposed on an inner surface portion of the droplet receiving portion are able to conduct electricity to each other via the droplet. Accordingly, if the conductivity between these electrodes is detected using the detector, it can be conformed that the droplet has been discharged normally.

If, however, the discharged droplet has not impacted in a normal state, namely, if scattering has occurred or if the discharge quantity is insufficient and a normal discharge has not taken place, then the droplet does not fill the droplet receiving portion which results in satisfactory conductivity between the electrodes not being exhibited. Accordingly, if this is detected using the detector, it can be confirmed that the droplet has not been discharged normally.

Accordingly, by performing this type of discharge performance inspection for all nozzles, for example, at the same time, the discharge performance can be inspected extremely easily and rapidly for a large number of nozzles.

Preferably, in the above described inspection apparatus, the inspection body is formed integrally with a base member on which discharge processing is to be performed by the droplet discharge head.

When the discharge performance of all of the nozzles is inspected using the inspection body, as is described above, and it is determined, for example, that all of the nozzles are normal, then the actual discharge processing is performed on the base member. At this time, if the inspection body is formed integrally with the base member, then because the positioning of the base member relative to the droplet discharge apparatus has already been made, it is possible to shorten the time between the inspection and the actual discharge processing.

Preferably, in the above described inspection apparatus, a non-conductive layer is formed on the substrate of the inspection body so as to cover the electrodes, and an open portion where the substrate is exposed is formed on the non-conductive layer, and the open portion is used as the droplet receiving portion.

By employing this type of structure, it is possible to prevent the detection accuracy of the discharge performance from deteriorating due to, for example, the impacted droplet spreading, or due to the impacted droplet coming out of the droplet receiving portion and making contact with the wires portions that are continuous with the electrodes.

According to another aspect of the present invention, there is provided a droplet discharge inspection method for inspecting a discharge performance of a droplet discharge head using the above described inspection apparatus, comprising: discharging a droplet from the droplet discharge head towards the droplet receiving portion of the inspection body in the inspection apparatus; and inspecting a discharge performance of the droplet discharge head by detecting using the detector a conductivity between exposed electrodes in an inner surface portion of a droplet receiving portion that has received a droplet discharge.

According to this droplet discharge inspection method, by detecting conductivity between the electrodes using the detector after discharging a droplet onto the droplet receiving portion as is described above, whether or not the droplet has impacted in a normal state can be confirmed, and, in accordance with this, the discharge performance can be detected.

Accordingly, by performing this type of discharge performance inspection for all the nozzles, for example, simultaneously, the discharge performance of a large number of nozzles can be inspected extremely easily and in a short time.

BRIEF DESCRIPTION OF THE DRAWINGS

FIGS. 6A and 6B are views showing an impact state when the quantity of droplets discharged is too small, according to this embodiment.

FIGS. 7A and 7B are views showing a variant example of the structure of wiring (i.e., electrodes) according to the present invention.

DETAILED DESCRIPTION OF THE INVENTION

The present invention is described in detail below.

Firstly, prior to describing the inspection apparatus and droplet discharge inspection method of the present invention, a description will be given of a droplet discharge apparatus that relates to the present invention.

Figure 1:
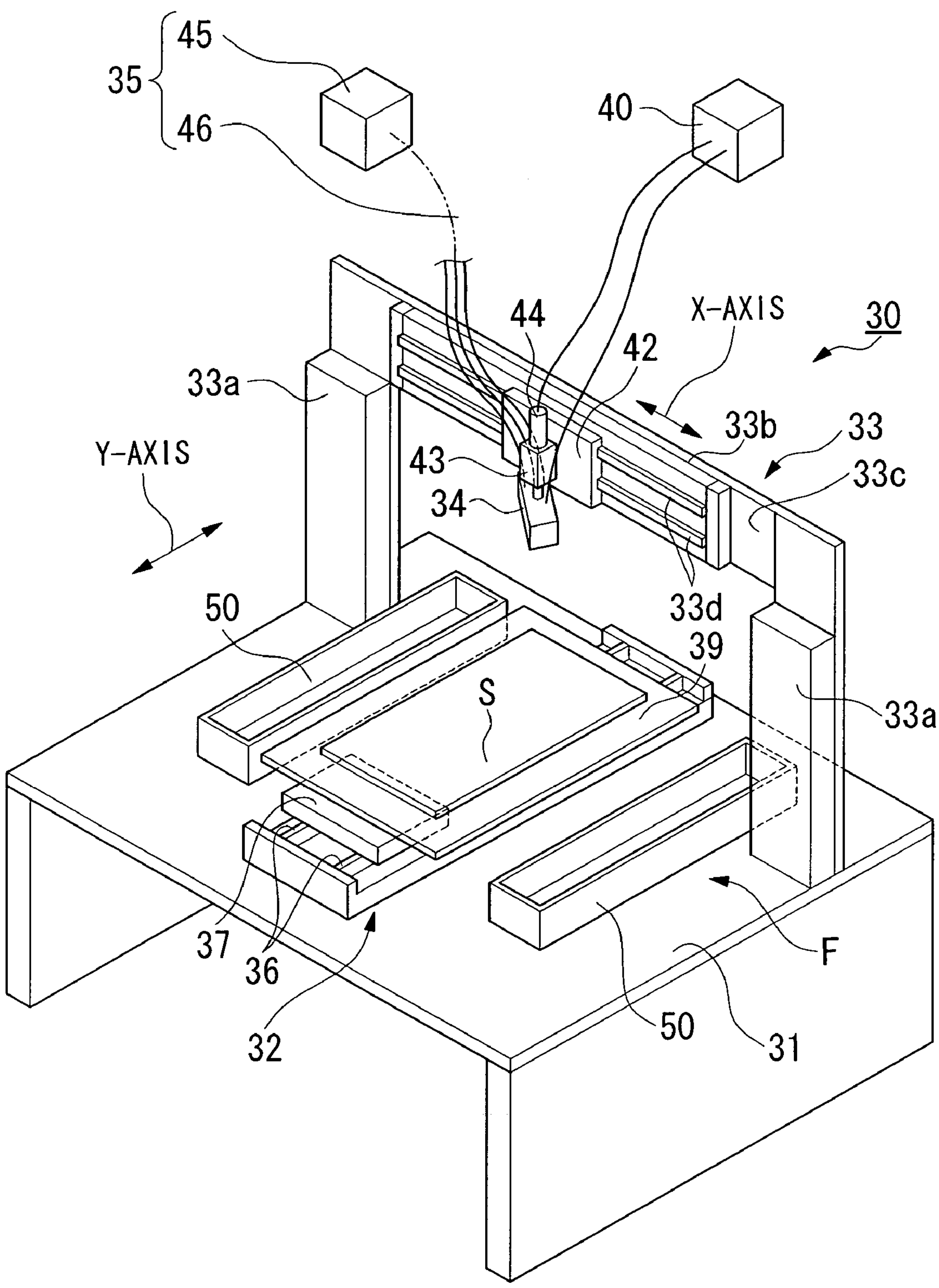
FIG. 1 is a perspective view showing the schematic structure of a droplet discharge apparatus according to the present invention.

FIG. 1 is a view showing an example of the droplet discharge apparatus of the present invention. In FIG. 1, the symbol 30 is a droplet discharge apparatus that is mainly used industrially. This droplet discharge apparatus 30 has a base 31, a substrate moving device 32, a head moving device 33, a droplet discharge head 34, a liquid supply device 35, a control unit 40, and the like. The substrate moving device 32 and the head moving device 33 are placed on top of the base 31.

The substrate moving device 32 is provided on top of the base 31, and has guide rails 36 that are aligned in a Y axial direction. The substrate moving device 32 is constructed so as to move a slider 37 along the guide rails 36 using, for example, a linear motor (not shown).

A stage 39 is fixed to the top of the slider 37. As a result, the substrate moving device 32 forms an axis of movement of the stage 39. The stage 39 positions a substrate (i.e., a base member) S and then holds the substrate S in this position. Namely, the stage 39 has a known suction holding device (not shown), and when this suction holding device is operated, the substrate S is held by suction on the stage 39. The substrate S is accurately positioned in a predetermined position on the stage 39, for example, by positioning pins (not shown) of the stage 39, and is held in this position.

Flushing areas F and F where flushing is performed on the droplet discharge head 34 are provided on the stage 39 on both sides of the substrate S, namely, on both sides in the direction of movement of the droplet discharge head 34 (i.e., the X axial direction) that is described below. Containers 50 that receive droplets from the droplet discharge head 34 as a result of the flushing are provided in the flushing areas F and F. The containers 50 are formed as rectangular parallelepipeds that extend in the direction of movement of the stage 39 (i.e., in the Y axial direction), and a member (not shown) such as a sponge that absorbs droplets is housed in the interior of each.

The head moving device 33 is provided with a pair of trestles 33*a* and 33*a* that stand upright at a rear portion side of the base 31, and a track 33*b* that is positioned on top of the trestles 33*a* and 33*a*. The track 33*b* is aligned in the X axial direction, namely, in a direction that is orthogonal to the Y axial direction of the substrate moving device 32. The track 33*b* is formed having a holding plate 33*c* that spans the gap between the trestles 33*a* and 33*a*, and a pair of guide rails 33*d* and 33*d* that are positioned on the holding plate 33*c*. The track 33*b* holds a carriage 42 on which is mounted the droplet discharge head 34 such that the carriage 42 is able to move in the longitudinal direction of the guide rails 33*d* and 33*d*. The carriage 42 is constructed such that it is made to travel on the guide rails 33*d* and 33*d* by the operation of a linear motor (not shown) or the like, and accordingly moves the droplet discharge head 34 in the X axial direction. Here, the carriage 42 is able to move, for example, in 1 μm units in the longitudinal direction of the guide rails 33*d* and 33*d*, namely, in the X axial direction, and such movement is controlled by the control unit 40 (described below).

The droplet discharge head 34 is rotatably attached to the carriage 42 via a mounting portion 43. A motor 44 is provided in the mounting portion 43 and a support shaft (not shown) of the droplet discharge head 34 is connected to the motor 44. Based on this type of structure, the droplet discharge head 34 is able to rotate in the circumferential direction thereof. The motor 44 is also connected to the control unit 40 and, accordingly, the rotation in the circumferential direction of the droplet discharge head 34 is also controlled by the control unit 40.

Figure 2A:
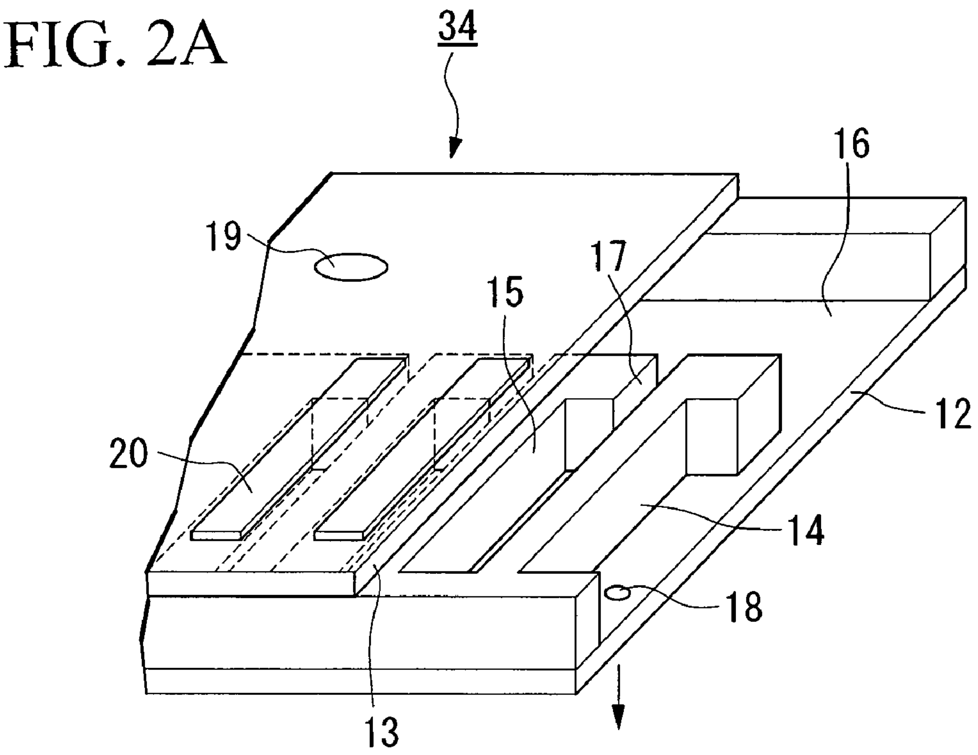
FIGS. 2A and 2B are views for describing the schematic structure of a droplet discharge head usable in the present invention.

Here, as is shown in FIG. 2A, the droplet discharge head 34 is provided with a nozzle plate 12 manufactured from, for example, stainless steel, and a diaphragm 13, and these two are joined together via partitioning members (i.e., reservoir plates) 14. A plurality of spaces 15 and a liquid holding section 16 are formed by the partitioning members 14. The interior of the respective spaces 15 and the liquid holding section 16 are filled with a liquid, and each of the spaces 15 is connected to the liquid holding section 16 by a supply aperture 17. A plurality of nozzle holes 18 that are used to eject the liquid from the spaces 15 are formed in rows both vertically and horizontally in the nozzle plate 12. A hole 19 that is used to supply liquid to the liquid holding section 16 is formed in the diaphragm 13.

Figure 2B:
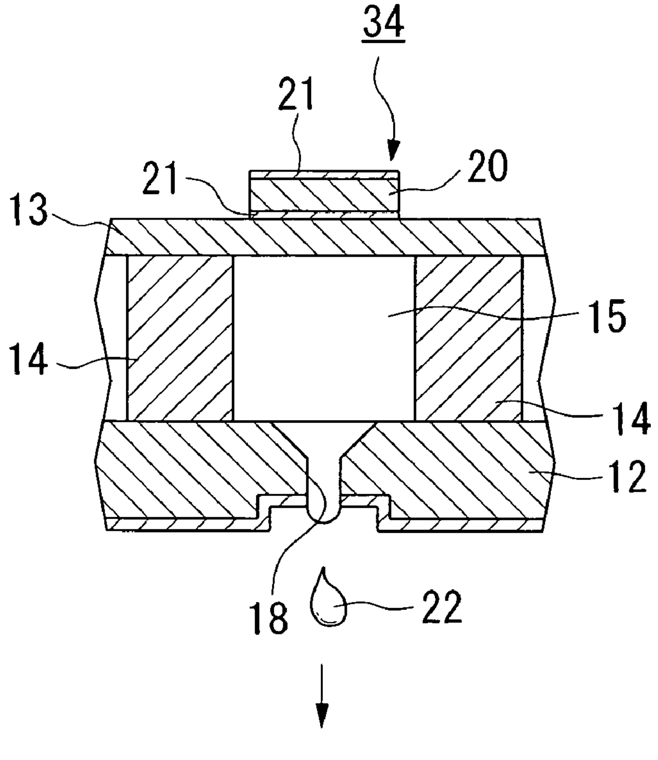

As is shown in FIG. 2B, piezoelectric elements 20 are joined to the surface of the diaphragm 13 that is on the opposite side from the surface that faces the spaces 15. The piezoelectric elements 20 have a pair of electrodes 21 and are formed so as to flex and protrude outwards when the electrodes 21 and 21 are energized. As a result of this type of structure, the diaphragm 13 to which the piezoelectric elements 20 are joined flexes outwards simultaneously together with the piezoelectric elements 20, thereby resulting in the volume of the spaces 15 increasing. Accordingly, liquid corresponding to the amount by which the volume has increased flows from the liquid holding section 16 into the spaces 15 via the supply ports 17. In this state, if the energizing of the piezoelectric elements 20 is then terminated, the piezoelectric elements 20 and the diaphragm 13 both return to their original states. Accordingly, because the spaces 15 also return to their original volumes, the pressure on the liquid inside the spaces 15 is raised, and droplets 22 of the liquid are discharged from the nozzle holes 18 towards a substrate.

The bottom surface of the droplet discharge head 34 that is constructed in the manner described above is formed substantially in a rectangular shape, and the nozzle holes 18 are arranged in 2 rows vertically and 180 rows horizontally. Note that, in FIG. 1, a single droplet discharge head 34 only is shown, however, in actual fact, a plurality of (for example, 12) droplet discharge heads 34 are provided arranged in parallel.

Moreover, in addition to a piezo jet type of droplet discharge head 34 that uses the above described piezoelectric elements 20, it is also possible to employ, for example, types that use thermoelectric converters and the like as energy generating elements.

The liquid supply device 35 has a liquid supply tube 46 that is connected to the liquid discharge head 34, and a tank 45 that is connected to the liquid supply tube 46.

The control unit 40 is formed by a CPU such as a microprocessor that performs control of the overall apparatus, and a computer or the like having various signal input and output functions. The control unit 40 controls discharge operations by the droplet discharge head 34, and movement operations by the substrate moving device 32.

Next, a description will be given of the inspection apparatus of the present invention that inspects a discharge performance of the droplet discharge head 34 in the above described droplet discharge apparatus 30.

Figure 3A:
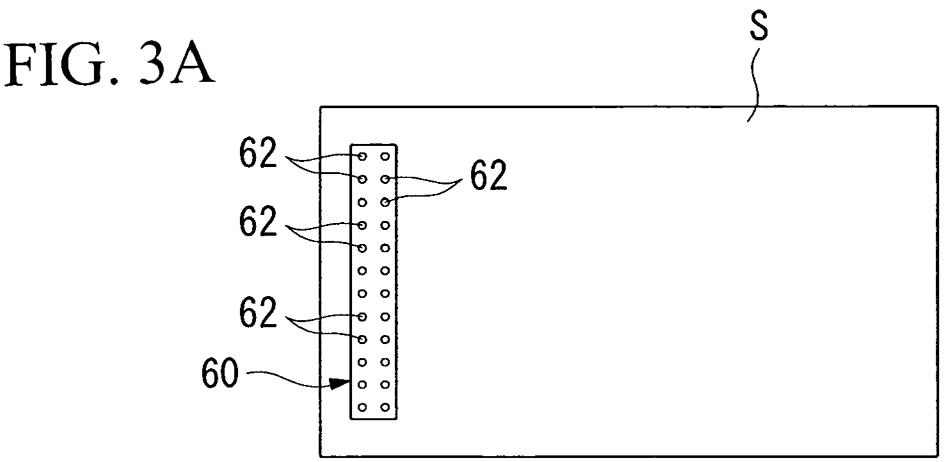
FIGS. 3A to 3C are views showing an embodiment of the inspection apparatus of the present invention.
Figure 3B:
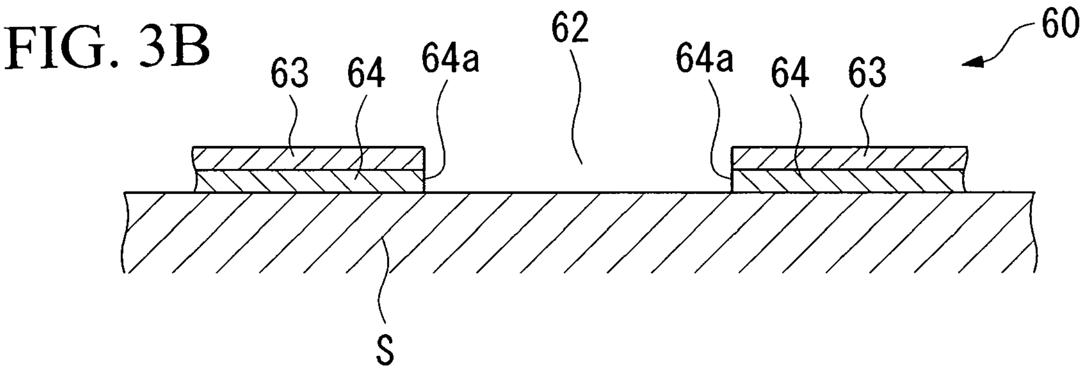
Figure 3C:
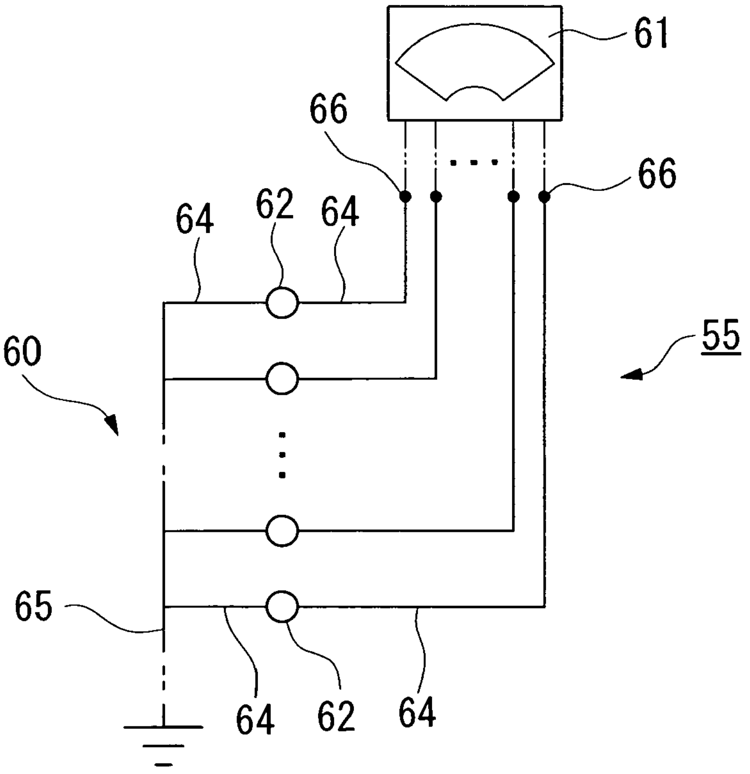

FIGS. 3A to 3C are views showing an embodiment of the inspection apparatus of the present invention. The symbol S in FIGS. 3A to 3C is a base member and 60 is an inspection body. As is shown in FIG. 3A, in the present embodiment the inspection body 60 is formed integrally with the base member S that undergoes discharge processing from the droplet discharge head 34. As is shown in FIG. 3C, the inspection body 60 together with a detector 61 constitute the inspection apparatus 55 of the present invention.

The base member S forms a substrate of the inspection body 60, and the inspection body 60 is formed along one side of the rectangular base member S. Here, the base member S forms a foundation for forming a variety of functional thin films and functional elements, and may be manufactured from a variety of substrates such as glass or silicon in accordance with the type of thin film or element. Substrates having a variety of component elements such as TFT, wires, non-conductive layers and the like formed on top thereof can also be used. In the present invention, the above types of substrate including those on which the above types of component elements have been formed are referred to as a "substrate". However, in the present embodiment, because the base member S doubles as the substrate of the inspection body 60, at least its surface portion is formed by a non-conductive material. Namely, in the present invention, provided that at least the surface portion thereof is non-conductive, a semiconductor such as silicon or a conductor such as metal can be used for the non-conductive substrate of the inspection body 60.

As is shown in FIG. 3A, a number of droplet receiving portions 62 . . . are formed on the substrate (i.e., the base member S) of the inspection body 60. These droplet receiving portions 62 . . . receive and hold droplets that are discharged from the droplet discharge head 34, and are formed in an arrangement that corresponds to the nozzle structure of the droplet discharge head 34 that is being inspected. In the droplet discharge head 34 of the present embodiment, as is described above, the nozzle holes 18 are arranged in 2 rows vertically and 180 rows horizontally. In addition, because a plurality of (for example, 12) droplet discharge heads 34 are arranged in parallel, to correspond to this, 2 rows vertically and (180××) (wherein x is the number of droplet discharge heads 34, for example, 12) rows horizontally of the droplet receiving portions 62 . . . are also provided.

Moreover, as is shown in FIGS. 3A and 3C, in the present embodiment, the droplet receiving portions 62 . . . are formed, when seen in plan view, as spaces having circular apertures. Namely, as is shown in FIG. 3B, a non-conductive layer 63 is formed on a substrate (i.e., on the base member S), and by forming aperture portions in a circular shape as seen in plan view in the non-conductive layer 63, the droplet receiving portions 62 are formed by these aperture portions, namely, by these spaces. Here, it is preferable that the wettability of the non-conductive layer 63 is made the same as that of the exposed substrate ((i.e., the base member S) surface inside the droplet receiving portions 62. Plasma irradiation processing or ultraviolet ray processing, for example, can be employed for the processing for making the wettability of the non-conductive layer 63 the same.

The droplet receiving portions 62 are formed at a size that corresponds to a condition when droplets that have been discharged from the droplet discharge head 34, as is described below, impact normally. Specifically, if the impact diameter (i.e., the size) when the droplets impact normally is taken as 100, then the inner diameter (i.e., the size) of the droplet receiving portion 62 shown in FIG. 3B is set to 90 or more and 99.5 or less, and preferably to 95 or more and 98 or less.

The lower limit value is set to 90 or more, and preferably to 95 or more because, the lower the lower limit value, the broader the allowable range when inspecting the scattering of the droplets, and the broader the allowable range when inspecting the lower limit value of the discharge quantity. In consideration, therefore, of the accuracy of the inspection of the scattering and of the discharge quantity, a lower limit value of 90 or more, and preferably 95 or more is desirable. In contrast, the upper limit value is set to 99.5 or less, and preferably 98 or less because, the higher the upper limit value, the narrower the allowable range when inspecting the scattering of the droplets, and the narrower the allowable range when inspecting the lower limit value of the discharge quantity. In consideration, therefore, of the accuracy of the inspection of the scattering and of the discharge quantity, an upper limit value of 99.5 or less, and preferably 98 or less is desirable.

Moreover, as is shown in FIG. 3C, a pair of wires 64 and 64 are formed for each single droplet receiving portion 62 on the substrate (i.e., the base member S). As is shown in FIG. 3B, the wires 64 are formed directly on the substrate (i.e., the base member S), and the non-conductive layer 63 is formed on the substrate (i.e., the base member S) so as to cover the wires 64. In addition, the pair of wires 64 and 64 that are provided for each droplet receiving portion 62, as is shown in FIG. 3C, are positioned, with both end surfaces thereof facing each other, so as to lie on a straight line that passes through the center of the droplet receiving portion 62, which is formed as a circle when seen in plan view. As is shown in FIG. 3B, the wires 64 and 64 are arranged so that end surfaces thereof are in a state of being exposed to an inner surface portion of the droplet receiving portion 62. Note that the end surfaces of the wires form electrodes 64*a* of the present invention.

Moreover, as is shown in FIG. 3C, all of the wires 64 that are located on one side of the droplet receiving portions 62 are connected to a single common wire 65, and this common wire 65 is further connected to the ground. In contrast, all of the wires 64 that are located on the other side of the droplet receiving portions 62 are connected to terminal portions 66 that are formed on the substrate (i.e., the base member S), and are further connected via these terminal portions 66 to the detector 61. Namely, wires (not shown) are connected to the terminal portions 66 via connection terminals that are removably connected to the terminal portions 66, and the detector 61 is further connected to the terminal portions 66 via these wires.

The detector 61 is constructed so as to detect the conductivity (i.e., the conductance) of objects of detection that are connected to the respective wires, namely, inside the droplet receiving portions 62, and, for example, to supply direct current from an in-built power supply to the droplet receiving portions 62 side. The detector 61 detects the conductivity (i.e., the conductance) by then measuring the electrical resistance in the droplet receiving portions 62.

Figure 4A:
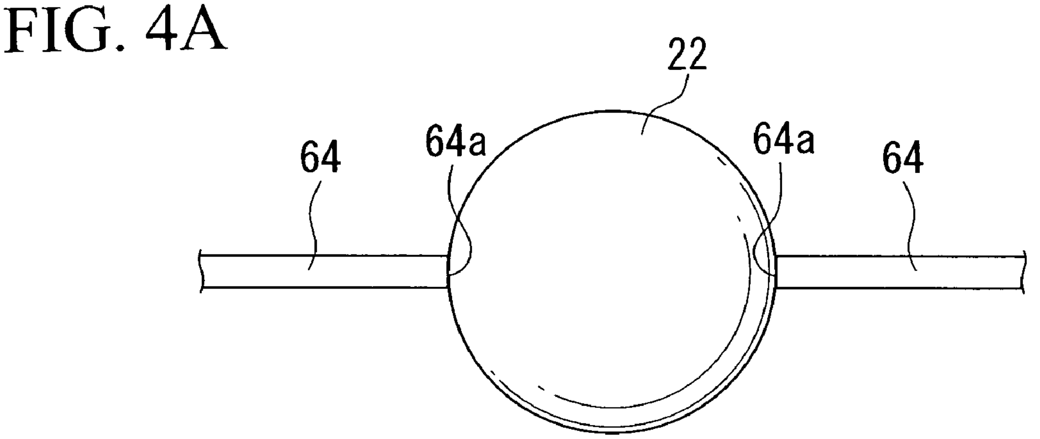
FIGS. 4A and 4B are views showing a state when droplets impact normally on a droplet receiving portion used in this embodiment.
Figure 4B:
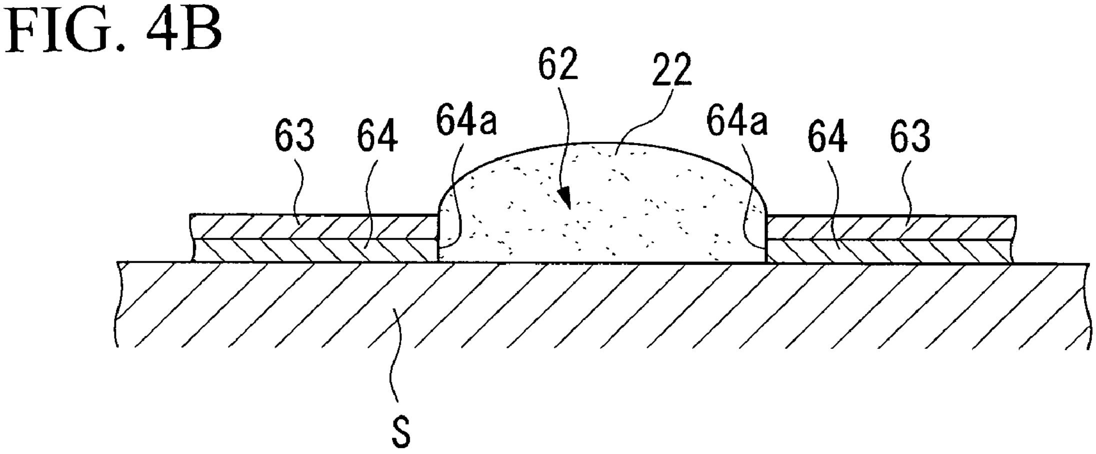

Namely, if droplets are discharged normally from the droplet discharge head 34 without scattering and without the discharge quantity being too small, and impact in a normal state on the droplet receiving portions 62, then, as is shown in plan view in FIG. 4A and in side cross-sectional view in FIG. 4B, the droplets 22 fill the droplet receiving portions 62. As a result, the electrodes 64*a* and 64*a* that are exposed to the inner surface portion of the droplet receiving portions 62 are made mutually conductive via the droplets 22. Accordingly, if the conductivity between the electrodes 64*a* and 64*a* (i.e., between the wires 64 and 64) is detected using the detector 61, it is possible to confirm that the droplets 22 have been discharged normally.

Figure 5A:
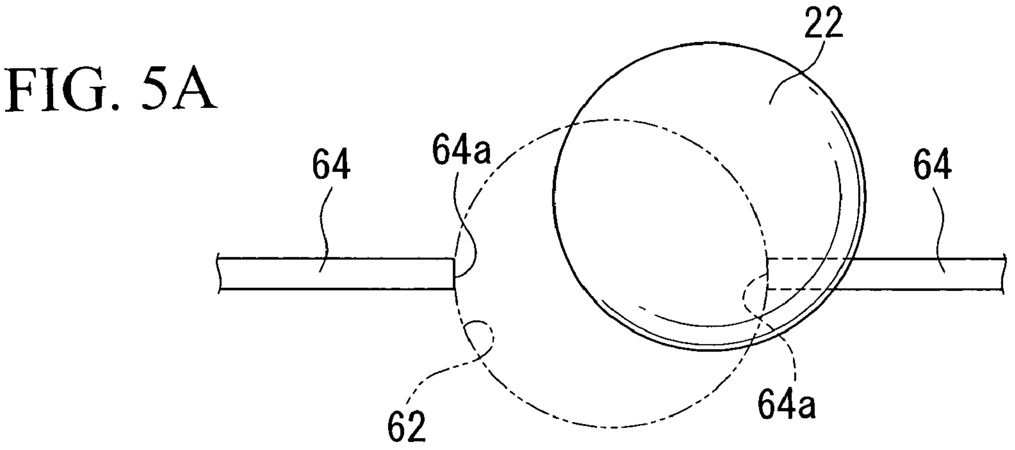
FIGS. 5A and 5B are views showing an impact state when scattering occurs in a droplet, according to this embodiment.
Figure 5B:
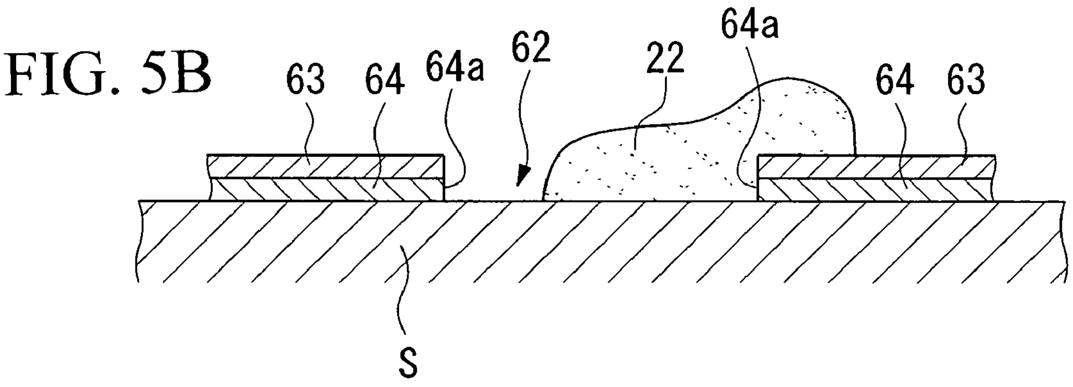

If, however, the discharged droplets have not impacted in a normal state, for example, if scattering has occurred, then as is shown in plan view in FIG. 5A and in side cross-sectional view in FIG. 5B, a portion of each droplet 22 may land on an outer side of the droplet receiving portion 62, resulting in the droplet 22 not filling the droplet receiving portion 62. Accordingly, no conductivity is exhibited between the electrodes 64*a* and 64*a*. If this is then detected using the detector 61, it is thereby possible to confirm that the droplets were not discharged normally.

If the quantity discharged was too small, the droplets 22 do not satisfactorily fill the droplet receiving portions 62. Accordingly, satisfactory conductivity is not exhibited between the electrodes 64*a* and 64*a*. If this is then detected using the detector 61, it is possible as a result to confirm that the droplets were not discharged normally. Note that, even in cases in which the discharge quantity was too small, when viewed in plan view, as is shown in plan view in FIG. 6A, the droplet 22 may possibly connect together the electrodes 64*a* and 64*a* due to a certain amount of moisture spreading. However, in this case as well, as is shown in side cross-sectional view in FIG. 6B, compared with the normal state shown in FIGS. 4A and 4B, the conductance is low due to the small contact area between the droplet 22 and the electrodes 64*a*. Accordingly, by determining in advance through experiment or the like a boundary value between the conductance obtained from a normal discharge and impact and the conductance when the discharge quantity is too small, it is possible to determine whether the discharge quantity was normal or was too small according to whether the conductance was greater than or less than the reference provided by this boundary value.

Note that here the detector 61 detects conductivity (i.e., conductance) by measuring electrical resistance, as is described above, however, any desired detector that is able to make quantitative measurements may be used instead of this such as, for example, a detector that detects current value.

Next, a description will be given of a method of inspecting a droplet discharge by the droplet discharge head 34 using the inspection apparatus 55 having the above described structure.

Firstly, a base member S is set in a predetermined position on the stage 39, and an inspection body 60 is placed in a discharge position of the droplet discharge head 34. Note that, prior to this, or else immediately after this, flushing of the droplet discharge head 34 may be performed if necessary. This flushing is performed to counter the following types of problems. Namely, particularly in cases such as when the solvent or dispersion medium in the liquid material that is discharged is highly volatile, in nozzles in which the discharge of the liquid material is not performed continuously, liquid that remains in the nozzle apertures causes a rise in viscosity due to the volatility of the solvent (or dispersion medium). In extreme cases, the liquid material may solidify or dust may adhere thereto, or blockages may be generated in the nozzle apertures by the ingress of foam or the like thereby causing discharge malfunctions.

Next, the relative positions of the droplet discharge head 34 and the inspection body 60 are adjusted if necessary using the substrate moving device 32 and the head moving device 33 so that the positions of each droplet receiving portion 62 of the inspection body 60 are matched to the positions of each nozzle of the droplet discharge head 34.

Once this positioning has been completed, a discharge is made from the droplet discharge head 34 from each nozzle either simultaneously or sequentially at suitable intervals.

If, as a result, droplets are discharged normally and land in a normal state on the droplet receiving portions 62, then, as is shown in FIGS. 4A and 4B, the droplets 22 satisfactorily fill the droplet receiving portions 62.

If, however, scattering occurs, then, as is shown in FIGS. 5A and 5B, a portion of the droplets 22 falls outside the droplet receiving portions 62.

Alternatively, if the amount discharged is too small, then, as is shown in FIGS. 6A and 6B, the droplets 22 do not satisfactorily fill the droplet receiving portions 62.

Therefore, by detecting the conductivity inside the droplet receiving portions 62 using the detector 61, an inspection of the discharge performance of the droplet discharge head 34, namely, of the discharge performance of each individual nozzle of all of the nozzles can be made. This detection is made sequentially for each droplet receiving portion 62, and the results may be sent, for example, to the control unit 40. In this manner, by inspecting the discharge performance of all of the nozzles using the detector 61, an inspection of the droplet discharging of the droplet discharge head 34 can be made.

Once the above described droplet discharge inspection has ended and the results thereof have been input, then if it is determined in the control unit 40 that the detected results indicate a normal discharge for all of the droplet receiving portions 62, namely, for all of the nozzles, the base member S is moved by the substrate moving device 32, and the droplet discharge head 34 is also moved by the head moving device 33. As a result, a regular discharge for forming a film pattern or the like is performed on the portion of the base member S to be processed.

If, on the other hand, a discharge abnormality is detected in even one nozzle, the movement of the base member S by the substrate moving device 32 is not performed, and naturally the regular discharge by the droplet discharge head 34 is also not continued. Notification of the abnormality is then given by an alarm or the like enabling a readjustment of the droplet discharge head 34 to be made.

In this type of method of inspecting a droplet discharge by the droplet discharge head 34 using the inspection apparatus 55, by detecting conductivity between the electrodes 64*a* and 64*a* using the detector 61 after discharging droplets from the respective nozzles onto the droplet receiving portions 62, whether or not the droplets 22 have impacted in a normal state can be confirmed, and, in accordance with this, the discharge performance of each nozzle can be detected. Accordingly, by performing this type of discharge performance inspection for all the nozzles simultaneously or sequentially, the discharge performance of a large number of nozzles can be inspected extremely easily and in a short time. This enables an improvement in productivity to be achieved.

Moreover, because the inspection body 60 is formed integrally with the base member S, when it is determined that all of the nozzles are normal, after the inspection has ended, the actual discharge processing for the base member S can be performed immediately. Accordingly, by shortening the time from the inspection until the actual discharge processing, productivity can be further improved. In addition, by positioning the inspection body 60 relative to the droplet discharge head 34, the base member S can be positioned at the same time. Therefore, the time required for these positioning operations can be shortened. Furthermore, because it is possible to obviate mispositioning when the inspection body 60 and the base member S are each being positioned, the accuracy of the positioning of the thin film and elements that are formed by performing the actual discharge can be improved.

Moreover, particularly for the inspection body 60, because the non-conductive layer 63 is formed on the substrate of the inspection body 60 (i.e., the base member S) so as to cover the wires 64 (i.e., the electrodes 64*a*), and because open portions are formed in this non-conductive layer 63 and these open portions are used as the droplet receiving portions 62, it is possible to prevent the detection accuracy of the discharge performance from deteriorating due to, for example, the impacted droplets spreading, or to the impacted droplets coming out of the droplet receiving portions 62 and making contact with the wires 64 that are continuous with the electrodes 64*a*.

Note that, in this embodiment, the inspection body 60 is formed integrally with the base member S, however, it is also possible to form the inspection body independently from the base member S. In this case, a single inspection body 60 can be used in turn for the processing of a plurality of base members S.

In addition, in this embodiment, the non-conductive layer 63 is formed on the substrate (i.e., on the base member S) so as to cover the wires 64 (i.e., the electrodes 64*a*), however, it is also possible to omit the non-conductive layer 63 and only form the wires 64 (i.e., the electrodes 64*a*) on the substrate (i.e., the base member S). If this type of structure is employed, the structure of the inspection body 60 can be further simplified allowing costs to be kept down.

The structure of the wires 64 (i.e., the electrodes 64*a*) is also not limited to the above described embodiment and various modifications thereto may be employed. For example, as is shown in FIG. 7A, instead of providing a pair of wires 64 (i.e., electrodes 64*a*) for each droplet receiving portion 62, it is also possible to provide two pairs of wires 64 in a cruciform shape and to measure the conductance between each of the facing wires 64. By employing this type of structure, even if the impacted droplets are partially deformed, as is shown by the double-dot chain line in FIG. 7A, and even if a portion thereof does not make contact with the electrodes 64*a*, this can be detected. Accordingly, the detection accuracy can be improved.

Furthermore, as is shown in FIG. 7B, it is also possible to provide a common electrode 67 in a center portion of an exposed bottom surface inside each droplet receiving portion 62, and to provide a plurality of, for example, four wires 64 in a radial configuration around the droplet receiving portion 62. The conductance between the common electrode 67 and each of the wires 64 can then be measured. In the same way as the case shown in FIG. 7A, if this type of structure is employed as well, it is also possible to detect when the impacted droplets have deformed and the like, and to consequently improve the detection accuracy.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. An inspection apparatus for inspecting a discharge performance of a droplet discharge head that discharges droplets, the inspection apparatus comprising:

an inspection body that includes a rectangular non-conductive substrate on which functional thin films and functional elements are formed;

a droplet receiving portion for receiving a droplet that is provided on the substrate;

a plurality of electrodes that are exposed on an inner surface portion of the droplet receiving portion; and a detector that is connected to the electrodes of the inspection body and detects the conductivity in the droplet receiving portion, wherein the inspection body is formed along one side of the rectangular non-conductive substrate, wherein the droplet receiving portion has a size that corresponds to a droplet size in a state when a discharged droplet impacts normally, and wherein a non-conductive layer is formed on the substrate of the inspection body so as to cover the electrodes, and an open portion where the substrate is exposed is formed on the non-conductive layer, and the open portion is used as the droplet receiving portion.

2. The inspection apparatus according to claim 1, wherein the inspection body is formed integrally with a base member on which discharge processing is to be performed by the droplet discharge head.

3. A droplet discharge inspection method for inspecting a discharge performance of a droplet discharge head, the droplet discharge inspection method comprising the steps of:

providing an inspection apparatus including:

an inspection body that includes a rectangular non-conductive substrate on which functional thin films and functional elements are formed;

a droplet receiving portion for receiving a droplet that is provided on the substrate;

a plurality of electrodes that are exposed on an inner surface portion of the droplet receiving portion; and a detector that is connected to the electrodes of the inspection body and detects the conductivity in the droplet receiving portion, wherein the droplet receiving portion has a size that corresponds to a droplet size when a discharged droplet impacts normally, wherein the inspection body is formed along one side of the rectangular non-conductive substrate, and wherein a non-conductive layer is formed on the substrate of the inspection body so as to cover the electrodes, and an open portion where the substrate is exposed is formed on the non-conductive layer, and the open portion is used as the droplet receiving portion, and discharging a droplet from the droplet discharge head towards the droplet receiving portion of the inspection body in the inspection apparatus; and inspecting a discharge performance of the droplet discharge head by detecting using the detector the conductivity between exposed electrodes in an inner surface portion of a droplet receiving portion that has received a droplet discharge.

* * * * *